United States Patent
Zhong et al.

(10) Patent No.: US 9,425,288 B2
(45) Date of Patent: Aug. 23, 2016

(54) METHOD OF MANUFACTURING SEMICONDUCTOR DEVICE

(75) Inventors: Huicai Zhong, San Jose, CA (US); Qingqing Liang, Lagrangeville, NY (US); Chao Zhao, Kessel-Io (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 78 days.

(21) Appl. No.: 14/412,237

(22) PCT Filed: Jul. 18, 2012

(86) PCT No.: PCT/CN2012/078837
§ 371 (c)(1),
(2), (4) Date: May 6, 2015

(87) PCT Pub. No.: WO2014/005360
PCT Pub. Date: Jan. 9, 2014

(65) Prior Publication Data
US 2015/0236134 A1 Aug. 20, 2015

(30) Foreign Application Priority Data
Jul. 2, 2012 (CN) .......................... 2012 1 0229040

(51) Int. Cl.
*H01L 29/66* (2006.01)
(52) U.S. Cl.
CPC ........ *H01L 29/66795* (2013.01); *H01L 29/665* (2013.01)
(58) Field of Classification Search
CPC ............... H01L 21/823821; H01L 21/823885; H01L 27/0924; H01L 2029/7858; H01L 21/823431; H01L 21/845; H01L 27/0886; H01L 27/10826; H01L 27/10879; H01L 27/1211; H01L 29/41791; H01L 29/66795; H01L 29/785; H01L 2924/13067
See application file for complete search history.

(56) References Cited

U.S. PATENT DOCUMENTS 7,105,894 B2   9/2006   Yeo et al.
8,310,013 B2   11/2012  Lin et al.
(Continued)

FOREIGN PATENT DOCUMENTS

CN   1525530 A     9/2004
CN   102157555 A   8/2011
CN   102299092 A   12/2011

OTHER PUBLICATIONS

International Preliminary Report on Patentability for PCT Application No. PCT/CN2012/078837, dated Jan. 6, 2015, 6 pages.
(Continued)

*Primary Examiner* — Mamadou Diallo
(74) *Attorney, Agent, or Firm* — Westman, Champlin & Koehler, P.A.

(57) ABSTRACT

A method of manufacturing a FinFET semiconductor device is provided, wherein the semiconductor fins are formed in a parallel arrangement which intersects the gates arranged in parallel. The polycrystalline silicon layer is deposited and then converted into a single crystal silicon layer such that the single crystal silicon layer and the semiconductor fins are integrated in essence, i.e., the source/drain region in the semiconductor fins is raised and the top area of the semiconductor fins is extended. Subsequently, the single crystal silicon layer above the top of the semiconductor fins is converted into a metal silicide so as to form a source/drain region contact. The source/drain region contact in the present invention has a larger area than that in a conventional FinFET, which decreases the contact resistance and facilitates the formation of a self-aligned metal plug in the follow-up process.

15 Claims, 15 Drawing Sheets

(56) References Cited

U.S. PATENT DOCUMENTS

| | | | |
|---|---|---|---|
| 2008/0277725 A1* | 11/2008 | Shino | H01L 21/84 257/347 |
| 2012/0049284 A1* | 3/2012 | Doris | H01L 27/1211 257/350 |
| 2013/0062708 A1* | 3/2013 | Zhong | H01L 29/66545 257/401 |
| 2013/0270655 A1* | 10/2013 | Adam | H01L 29/66545 257/410 |
| 2013/0307076 A1* | 11/2013 | Cheng | H01L 21/845 257/350 |

OTHER PUBLICATIONS

International Search Report and Written Opinion (English translation of Search Report only) for PCT Application No. PCT/CN2012/078837, dated Apr. 11, 2013, 14 pages.

* cited by examiner

METHOD OF MANUFACTURING SEMICONDUCTOR DEVICE

CROSS-REFERENCE TO RELATED APPLICATION

This application is a national stage application, filed under 35 U.S.C. §371, of PCT Application No. PCT/CN2012/078837, filed on Jul. 18, 2012, which published as WO 2014/005360 A1 on Jan. 9, 2014, entitled "METHOD OF MANUFACTURING SEMICONDUCTOR DEVICE," which claims priority to Chinese Patent Application No. 201210229040.4, filed on Jul. 2, 2012, all of which is incorporated herein by reference in its entirety.

TECHNICAL FIELD

The present invention relates to a field of manufacturing a semiconductor device. In particular, the present invention relates to a method of manufacturing a FinFET (fin Field Effect Transistor).

BACKGROUND ART

Over 30 years, semiconductor devices have been scaled down according to Moore's Law. The feature size of semiconductor integrated circuit continuously reduces and the level of integration continuously increases. As the technology node enters the deep sub-micron area, such as 100 nm or less, even less than 45 nm or less, traditional field-effect transistors (FETs), i.e., planar FETs, begin to be subject to limitations of various basic physical laws, challenging the scaled down prospect. Many FETs with new structures are developed to meet the actual needs, wherein FinFET is a new structural device with a great scaled-down potential.

A FinFET, i.e., a fin field-effect transistor, is a multi-gate semiconductor device. Due to the unique characteristics in structure, FinFET becomes a promising device beyond 22 nm technology node. Referring to FIG. 1, a FinFET comprises a Fin 2 perpendicular to the substrate 1. The Fin is formed as a fin-shaped semiconductor column. Unlike a conventional planar FET, the channel region of the FinFET is located within the Fin. A gate dielectric layer 3 and a gate 4 surround Fin at the side surfaces and the top surface to form a gate having at least two sides, i.e., a gate located on both side surfaces and the top surface of Fin, thereby gaining better control over the channel region. It becomes possible to provide "fully depleted" type operation. The two ends of the Fin 2 that are not surrounded by gate 4 are source/drain region 5. By controlling the thickness of the Fin 2, FinFET exhibits excellent characteristics: better short channel effect suppression, better sub-threshold slope, low off-state current, elimination of the floating body effect, lower operating voltage, and more advantageous to be scaled-down. In order to obtain a greater driving force, a plurality of parallel semiconductor fins can be controlled by one gate. Referring to FIG. 2, a plurality of Fins 2 are controlled by the one gate 4, wherein the obtained FinFET has greater driving capability so that the circuits have better performance. FIG. 3 is a microphotograph of a FinFET with a plurality of parallel semiconductor fins.

Due to the shape of the semiconductor fins, the surface area of the top of Fin is very small. Thus, the contact area of the FinFET source/drain region used to form a contact plug is very small. Meanwhile, it is more difficult to form a source/drain region contact by a self-aligned process since the contact area is small. Due to the small contact area and the process variation, the FinFET source/drain region contact plug formed by self-aligned metal materials has a large contact resistance, which will result in large parasitic capacitance and significantly reduce the speed of the entire circuit. Therefore, there is a need to provide a method of manufacturing a FinFET to solve the above problem with the proviso that the inherent advantages of FinFET are ensured.

DETAILED DESCRIPTION OF THE INVENTION

Regarding the poor contact of the source/drain region of the FinFET device, the present invention provides a process scheme of forming a raised source/drain region so as to form contacts. The present invention provides a method of manufacturing a FinFET used in the manufacture of FinFET devices, which includes the following steps:

providing a semiconductor substrate, on which a plurality of semiconductor fins arranged in parallel are formed;

depositing a gate insulation layer and a gate material, defining the gate pattern, forming a plurality of parallel gates which intersects the semiconductor fins, and defining the channel region of FinFET;

forming a spacer located on side surfaces of the gate and the semiconductor fins;

depositing a poly crystalline silicon layer, and then planarizing the poly crystalline silicon layer to expose the top of the gate;

monocrystalizing the polycrystalline silicon layer to form a single crystal silicon layer;

forming an isolation structure which cuts off the semiconductor fins;

forming a metal silicide by reacting of the single crystal silicon layer located on the top of the semiconductor fins with a metal, wherein the formed metal silicide is a source/drain region contact; and cutting the plurality of gates arranged in parallel in accordance with the predetermined region to form a gate isolation trench, thereby obtaining the desired FinFET.

In the method of the present invention, the semiconductor substrate is an SOI substrate, or the semiconductor substrate is a single crystal substrate of Si, SiGe, SiC, InAs, GaN, AlGaN, InP, or any combination thereof, the semiconductor fins are made of a single crystal material of Si, SiGe, SiC, InAs, GaN, AlGaN, or InP. The formation of the plurality of semiconductor fins arranged in parallel on the semiconductor substrate includes: forming the pattern of the semiconductor fins by lithography and anisotropically etching the semiconductor substrate so as to form the semiconductor fins.

In the method of the present invention, a gate-first process is employed, the gate is a non-sacrificial gate, and the material of the gate is a metal or metal silicide.

In the method of the present invention, a gate-last process is employed, the gate is a sacrificial gate, and the material of the gate is polycrystalline silicon; wherein after the source/drain region contact is formed, the gate-last process is performed, including:

removing the gate and the gate insulation layer; and forming a replacement gate insulation layer and a replacement gate in the gate-last process.

In the method of the present invention, the replacement gate insulation layer in the gate-last process is a metal or metal silicide; the material of the replacement gate insulation layer in the gate-last process is selected from $HfO_2$, $ZrO_2$, $LaAlO_3$, and the material of the replacement gate in the gate-last process is selected from Al, W, Ti, Ta, or silicide thereof.

In the method of the present invention, the step of monocrystalizing the polycrystalline silicon layer includes: converting the polycrystalline silicon layer into the single crystal silicon layer by a laser annealing process. The laser annealing process is a high-temperature laser annealing process, wherein the annealing temperature is 1000° C. and the time is 1 second.

In the method of the present invention, the step of forming the spacer includes: depositing a spacer material layer on the semiconductor substrate, and then removing the spacer material layer at the top of the gate and at the top of the semiconductor fins by an anisotropic etching process to keep the spacer material only on side surfaces of the gate and the semiconductor fins, so as to form the spacer, wherein the material of the spacer is $SiO_2$ or $Si_3N_4$.

In a method of the present invention, the step of forming a gate isolation trench includes: etching a predetermined region of the gate such that the plurality of gates are cut so as to form the gate isolation trench. Moreover, the spacer is partially or completely etched upon forming the gate isolation trench. Furthermore, after the gate isolation trench is formed, the gate isolation structure is filled with an isolation dielectric.

The present invention provides a method of manufacturing a FinFET device. In the present invention, the semiconductor fins are formed in parallel to intersect a plurality of parallel gates, which is advantageous to cutting according to the requirements in the subsequent process so as to obtain the desired FinFET. By depositing the polycrystalline silicon layer and converting it into a single crystal silicon layer by laser annealing, the single crystal silicon layer and the semiconductor fins are substantially integrated together. Since an identical single crystal silicon layer formed at the top of the semiconductor fins, i.e., the source/drain region in the semiconductor fins is raised, and the top area of the semiconductor fins is extended, it facilitates the formation of the subsequent source/drain region contact. Later, the single crystal silicon layer above the top of the semiconductor fins is converted into a metal silicide, thereby forming source/drain region contact. Since the source/drain region contact has a larger area than that in a conventional FinFET, the contact resistance decreases, which facilitates the formation of the self-aligned metal plug in the follow-up process.

EMBODIMENTS

Figure 1:
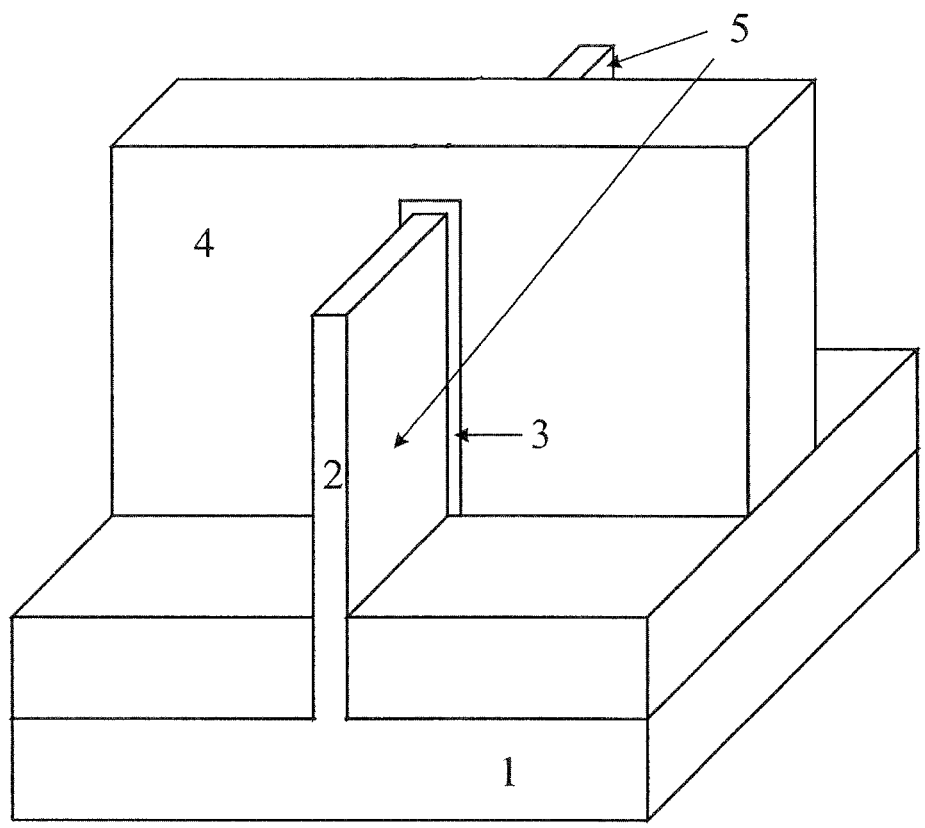
FIG. 1 is a conventional FinFET device structure.
Figure 2:
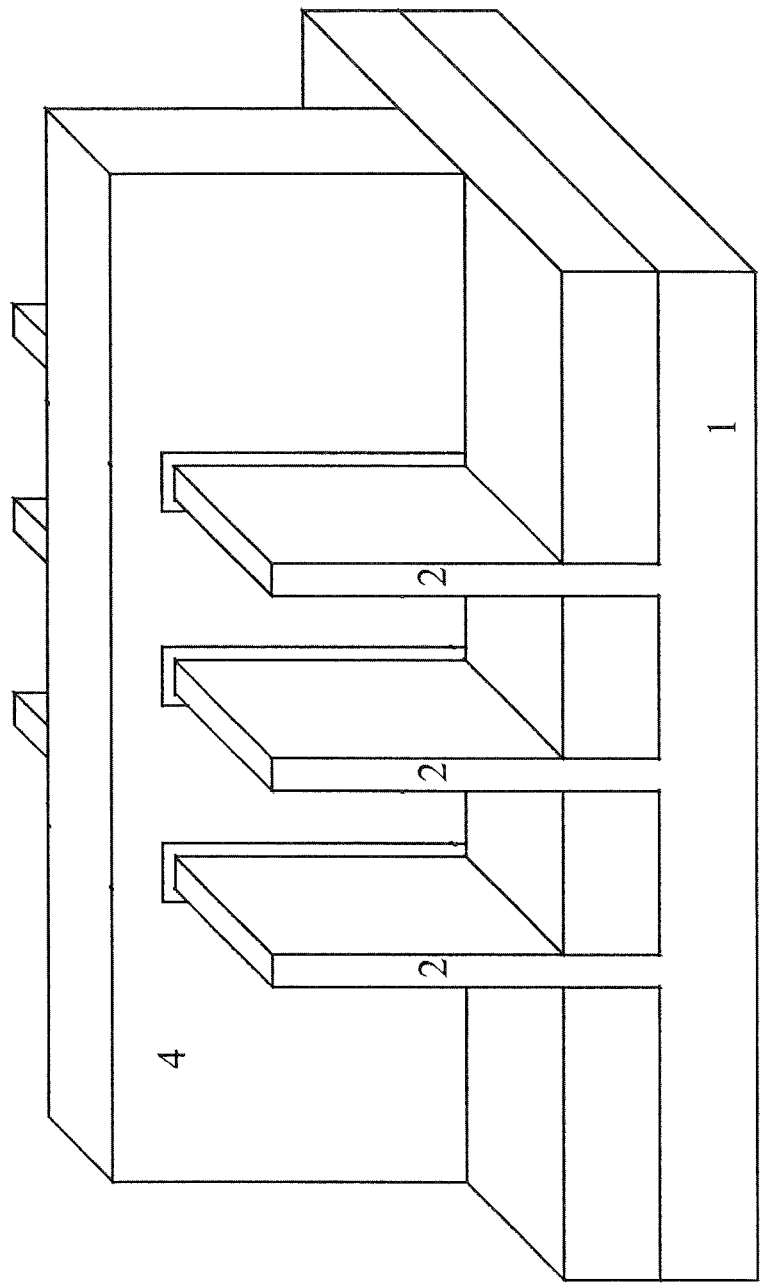
FIG. 2 is a conventional FinFET device structure having a plurality of parallel semiconductor fins.
Figure 3:
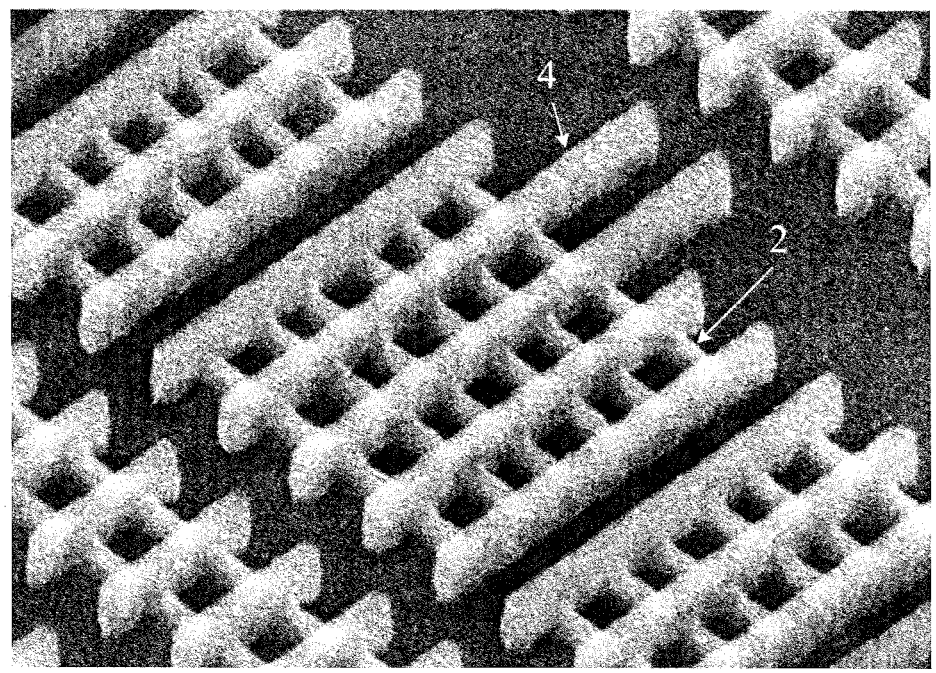
FIG. 3 is microphotograph of a conventional FinFET device having a plurality of parallel semiconductor fins.

The present invention is described according to the embodiments shown in the drawings. But it should be understood that these descriptions are only exemplary, and are not to limit the scope of the invention. In addition, the following description omits the description of the generally-known structure and technology to avoid unnecessary confusion of the concept of the present invention.

The present invention provides a method of manufacturing FinFET (please refer to FIGS. 1-9 for the manufacturing process).

Figure 4A:
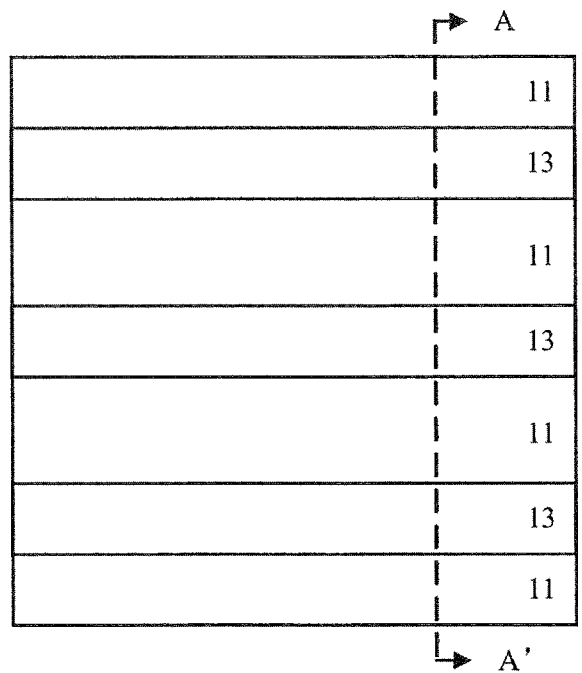
FIGS. 4A-12B are procedure processes of the manufacturing method of the present invention.
Figure 4B:
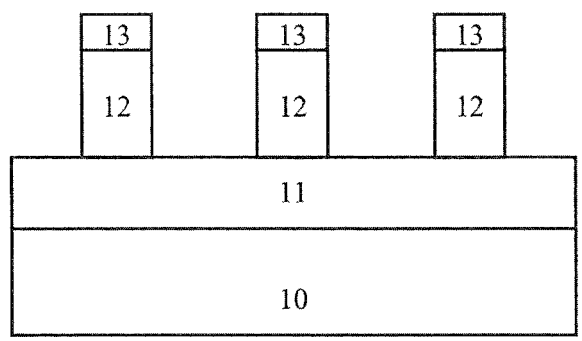

First of all, referring to FIGS. 4A and 4B, Fins 12 (semiconductor fins) are formed on the semiconductor substrate 10, wherein FIG. 4A is a planar view and FIG. 4B is a cross-sectional view of FIG. 4A along the line AA'; in this embodiment, an SOI (silicon on insulator) substrate is employed; besides, the substrate material can also employ a single crystal Si, SiGe, SiC, InAs, GaN, AlGaN, InP, or combinations thereof. The semiconductor substrate 10 has an insulating layer 11 having a top layer semiconductor layer thereon (not shown, i.e., a layer used to form Fin), wherein the insulating layer 11 is typically $SiO_2$. A plurality of parallel Fins 12 with side surfaces and top surface are formed on the semiconductor substrate 10. In this embodiment, the method of forming the Fin 12 specifically include: first forming a hard mask 13 on the top layer semiconductor layer of the SOI substrate, the material of the hard mask 13 being $Si_3N_4$, and coating the photoresist, forming patterns of the Fin 12 by lithography, and anisotropically etching the top layer semiconductor layer with the patterned hard mask 13 as a mark so as to obtain the Fin 12. The fin 12 (i.e., a top layer semiconductor layer) is a single crystal Si, optionally, a single crystal SiGe, SiC, InAs, GaN, AlGaN, InP, or any combination thereof. In another embodiment, The fin 12 can also be directly formed on the bulk silicon substrate by an epitaxial process. After The fin 12 is formed, the patterned hard mask 13 is removed.

Figure 5A:
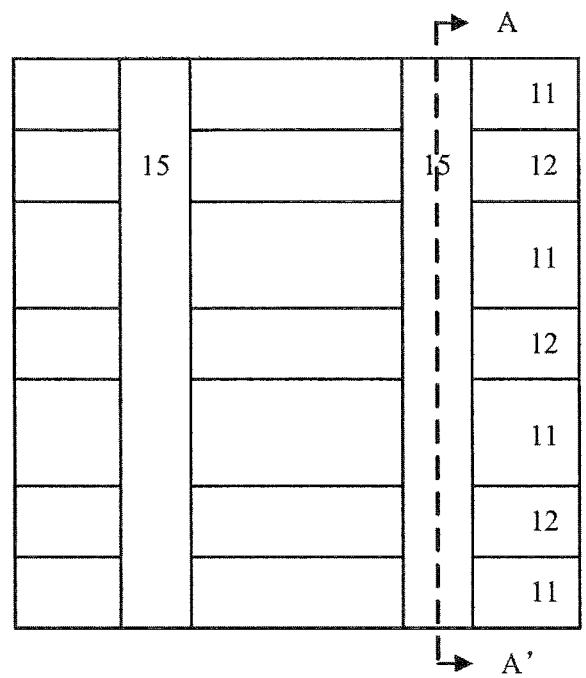
Figure 5B:
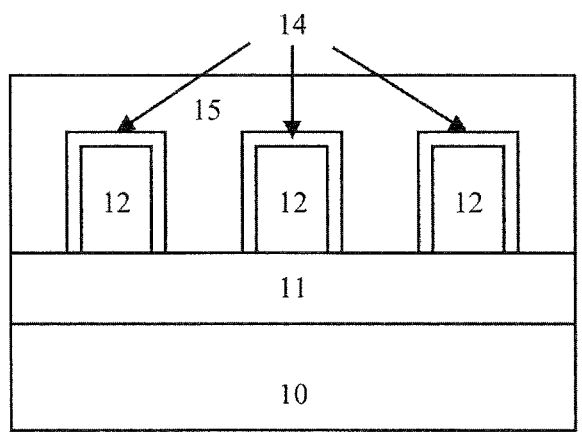

Then, a gate insulation layer 14 and a gate 15 are formed (see FIGS. 5A and 5B, wherein FIG. 5A is a planar view and FIG. 5B is a cross-sectional view of FIG. 5A along the line AA'). First, a gate insulating material film such as a $SiO_2$ film is deposited, more preferably using a high-K gate insulating material with a dielectric constant larger than $SiO_2$, which is more favorable to transistor device performance. The high-K gate insulating materials include some metal oxides, metal aluminates and the like, e.g., $HfO_2$, $ZrO_2$, $LaAlO_3$, etc. The gate insulation layer 14 need to achieve its gate insulating properties and have a thickness as thin as possible, the thickness preferably being 0.5-10 nm. The deposition process is, for example, thermal oxidation or CVD. After the gate insulation layer 14 is formed, the material of the gate 15 is deposited. This embodiment employs a gate-last process, wherein both the gates and the gate insulation layer are sacrificial layers, which will be removed in the subsequent steps. Therefore, the gate 15 herein is of a polysilicon material. After deposition of the gate material, gate patterns are formed by photoresist coating, lithography, defining the gate patterns, and etching the gates 15 and the gate insulation layer 14, successively. In the present invention, a number of gate pattern arranged in parallel interact with a number of parallel Fins 12, defining a channel region of FinFET. In another embodiment, a gate-first process can be employed to directly form a non-sacrificial gate 15. Optionally, a metal silicide, metal and the like are used as gate materials, for example, of Al, W, Ti, Ta, or silicide thereof.

Figure 6A:
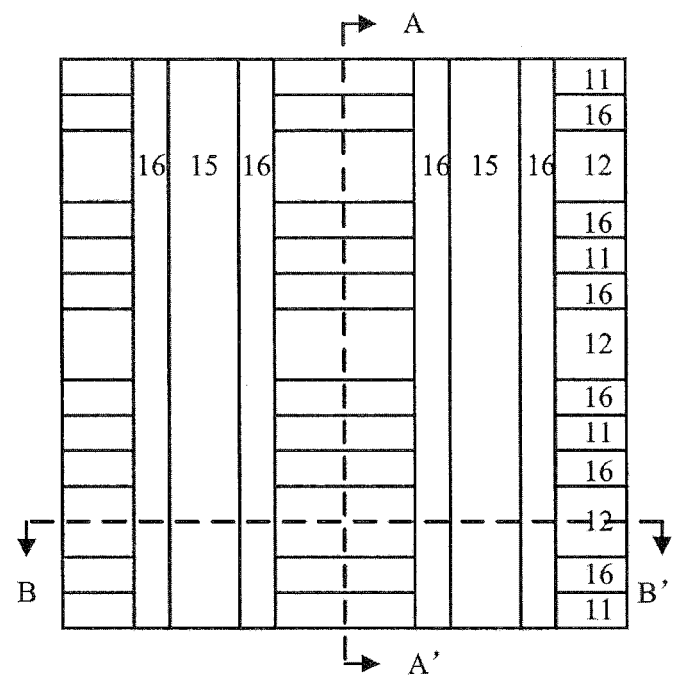
Figure 6B:
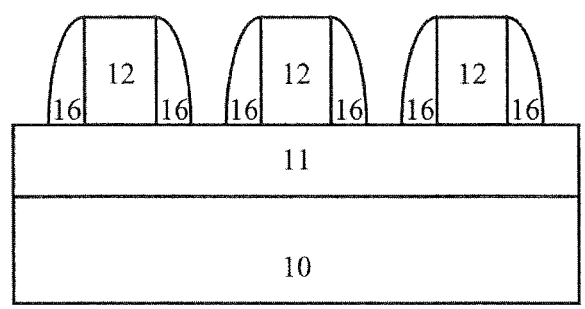
Figure 6C:
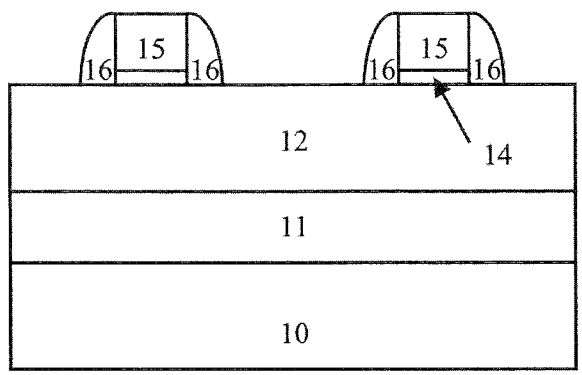

Then, a spacer 16 is formed (see FIGS. 6A-6C, wherein FIG. 6A is a planar view. FIG. 6B is a cross-sectional view of FIG. 6A along the line AA', and FIG. 6C is a cross-sectional view of FIG. 6A along the line BB'). The spacer 16 is formed on the side surfaces of the gate 15 and the fin 12. First, a spacer material layer is deposited on the substrate, e.g., $SiO_2$, $Si_3N_4$, and the like, where a deposition process with good shape-keeping performance is employed to cover the entire substrate with a desired thickness; then, an anisotropic etching process is employed to remove the spacer material layer at the top of the gate 15 and at the top of The fin 12 such that the spacer material layer is only left on the side surfaces of the gate 15 and the fin 12, thereby forming a spacer 16.

Figure 7A:
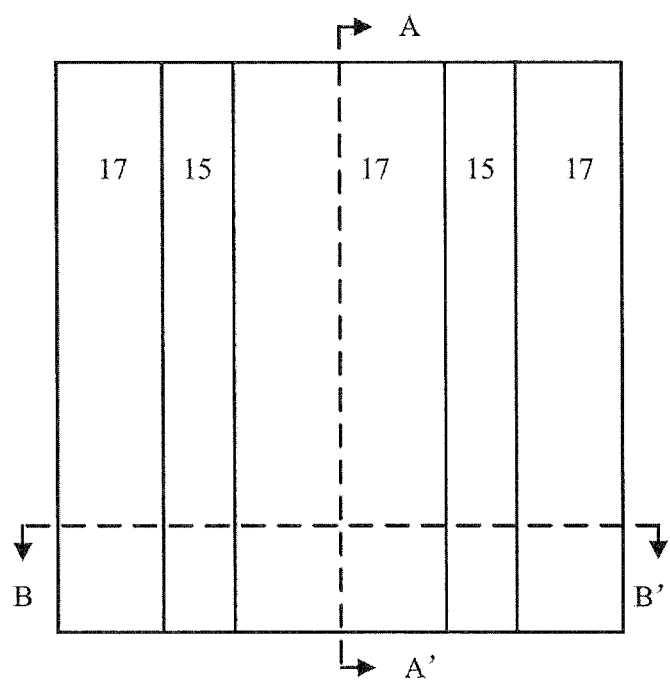
Figure 7B:
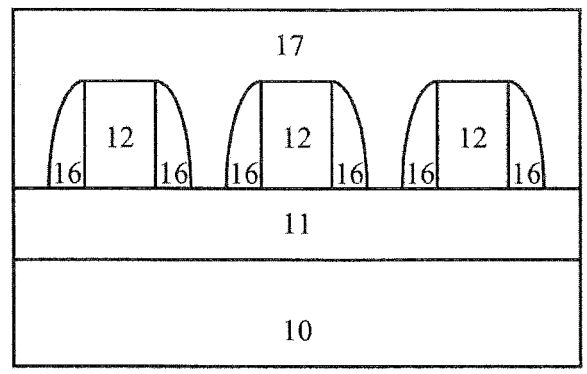
Figure 7C:
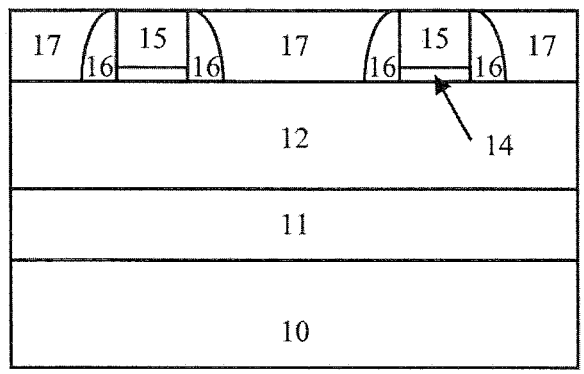

Then, a polycrystalline silicon layer 17 is formed (see FIGS. 7A-7C, wherein FIG. 7A is a planar view, FIG. 7B is a cross-sectional view of FIG. 7A along the line AA', and FIG. 7C is a cross-sectional view of FIG. 7A along the line BB'). The polycrystalline silicon layer 17 is deposited on the substrate to cover the fin 12 and gate 15, and then planarization, e.g., CMP process, is performed to thin the polycrystalline silicon layer and expose the top of the gate 15.

Figure 8A:
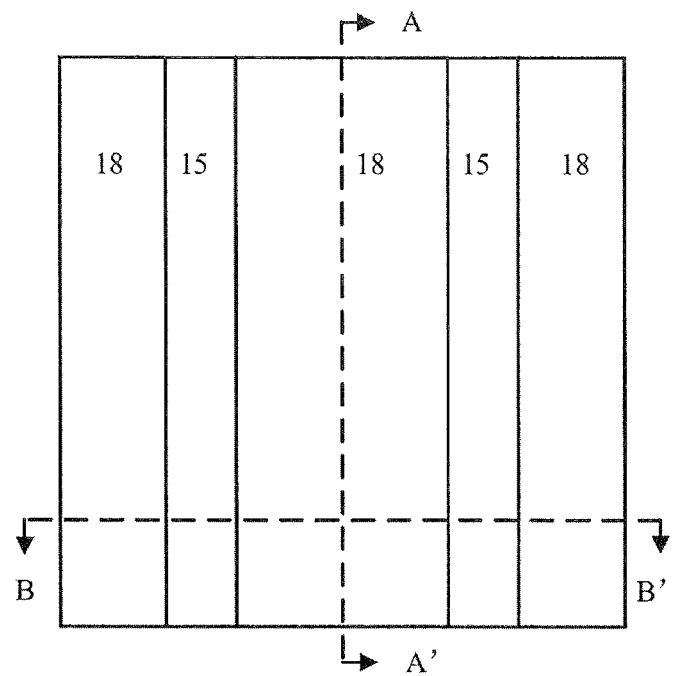
Figure 8B:
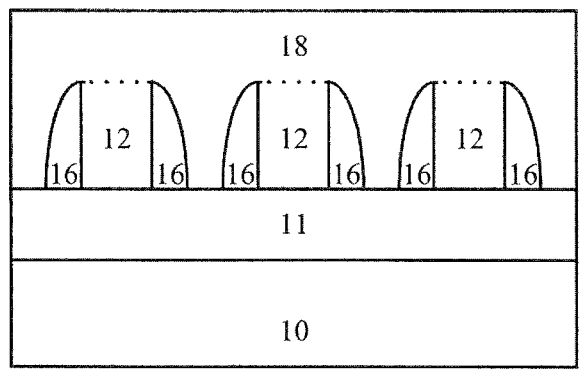
Figure 8C:
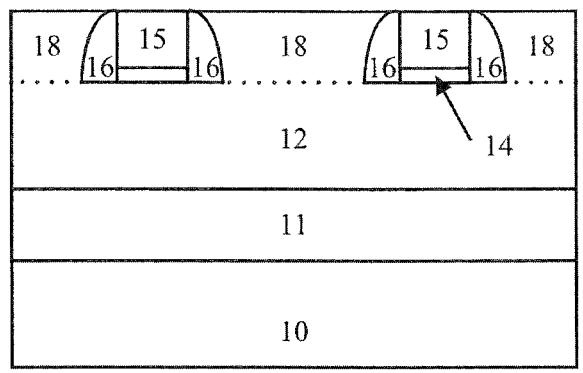

Then, the crystal silicon layer 17 is monocrystalized to form a single crystal silicon layer 18 (see FIGS. 8A-8C, wherein FIG. 8A is a planar view. FIG. 8B is a cross-sectional view of FIG. 8A along the line AA', and FIG. 8C is a cross-sectional view of FIG. 8A along the line BB'). The method of monocrystallizing the crystal silicon layer 17 is specifically as follows: employing a high-temperature laser annealing process, using the fin 12 of single crystal Si as the seed layer, and completely converting the polycrystalline silicon layer 17 into a monocrystalline silicon layer 18. The temperature for high-temperature laser annealing is 1000° C., and the time is one second. The dotted line in FIGS. 8B and 8C separates the Fin 12 from the single crystal silicon layer 18, meaning that their materials as well as crystal characteristics are the same and are substantially integrated together, but are formed in different steps. As a result (see FIG. 8B), an identical single crystal silicon layer 18 is formed at the top of the Fin 12, i.e., the source/drain region in the Fin 12 is raised and the top area of the Fin 12 is extended, which facilitates the formation of the subsequent source/drain region contact.

Figure 9A:
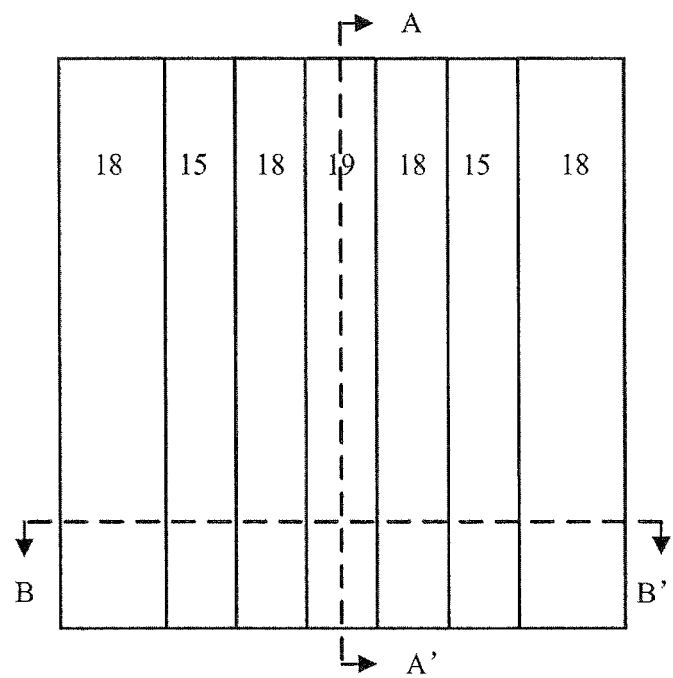
Figure 9B:
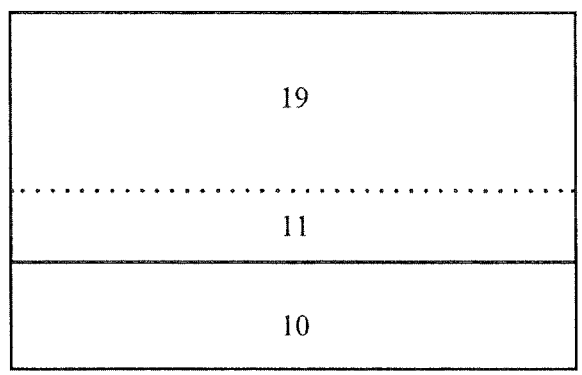
Figure 9C:
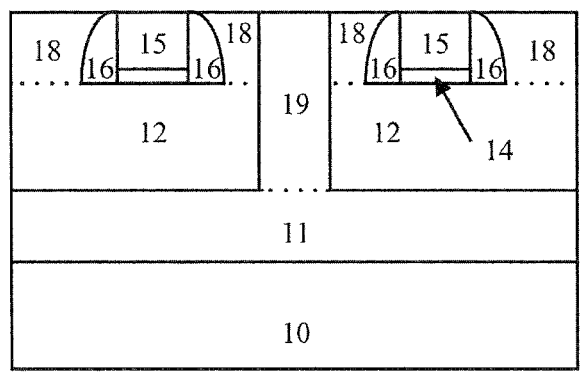

Then, an isolation structure 19 is formed (see FIGS. 9A-9C, wherein FIG. 9A is a planar view, FIG. 9B is a cross-sectional view of FIG. 9A along the line AA', and FIG. 9C is a cross-sectional view of FIG. 9A along the line BB'). The isolation structure 19 is used for insulating and isolating different FinFETs. In the predetermined region for forming an isolation structure 19, etching process is employed to remove the single crystal layer 18 and the Fin 12, i.e., cutting the Fin 12 until the insulating layer 11 of the substrate is exposed to form an isolation trench: then, filling an insulating material in the isolation trench, e.g., $SiO_2$, and then perform planarization, e.g., employ a CMP process to expose the top surfaces of the single crystal silicon layer 18 and the gate 15 so as to obtain an isolation structure 19. In the present invention, the isolation structure 19 is located between two adjacent gates 15, and is arranged in parallel with the gates 15. The dotted line in FIG. 9B and FIG. 9C separates the insulating layer 11 from the isolation structure 19, which means that their materials can be the same, e.g., $SiO_2$, are integrated in essence, but are formed in different steps. In another embodiment, the materials of the insulating layer 11 and the isolation structure 19 can be different.

Figure 10A:
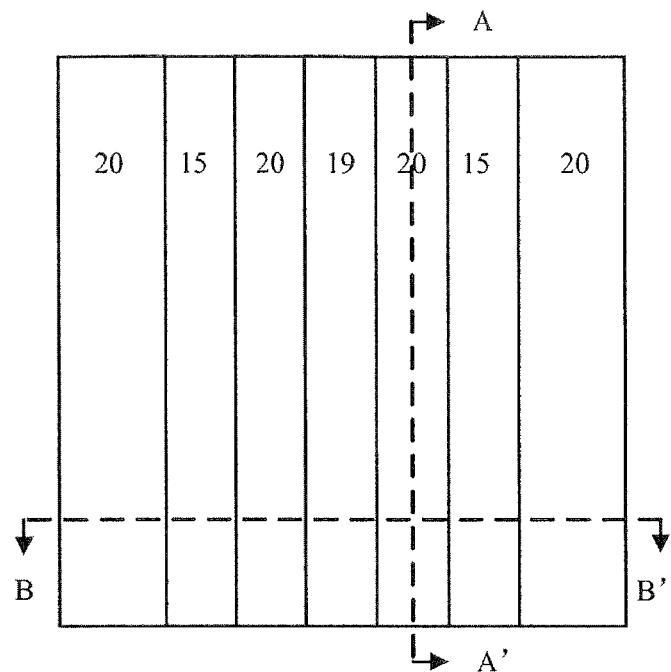
Figure 10B:
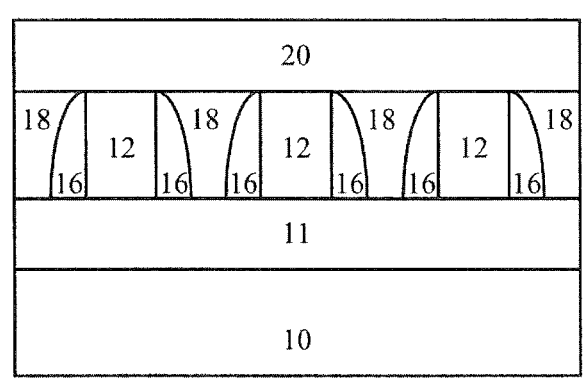
Figure 10C:
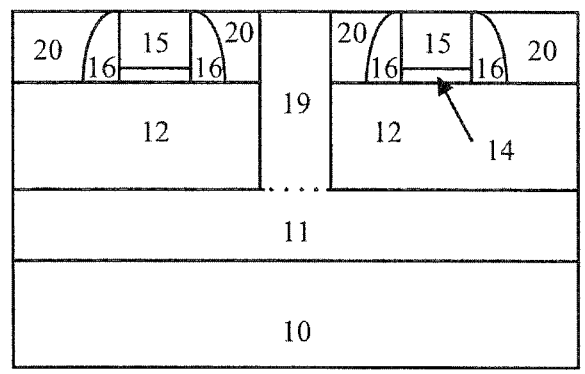

Then, a source/drain region contact 20 is formed (see FIGS. 10A-10C, wherein FIG. 10A is a planar view. FIG. 10B is a cross-sectional view of FIG. 10A along the line AA', and FIG. 10C is a cross-sectional view of FIG. 10A along the line BB'). In this step, by depositing a metal and reacting it with a single crystal silicon layer 18, the single crystal silicon layer 18 at the top of the Fin 12 is converted into a metal silicide (see FIGS. 10B and 10C). The metal employed can be Ni or NiPt, the metal silicide formed is a Ni silicide or NiPt silicide, and the metal silicide formed is used as source/drain region contact 20. In the step of FIGS. 8A-8C, since the source/drain region of FinFET has been raised and the top area of Fin 12 has been extended, the area the source/drain region contact 20 formed in the step contacts the source/drain region is larger than conventional FinFET. Thus, it can reduce contact resistance so as to obtain better contact effects. Moreover, the increase of the contact area and the expansion of the area of the source/drain region contact 20 facilitates the formation of a self-aligned metal plug in the subsequent process.

Figure 11A:
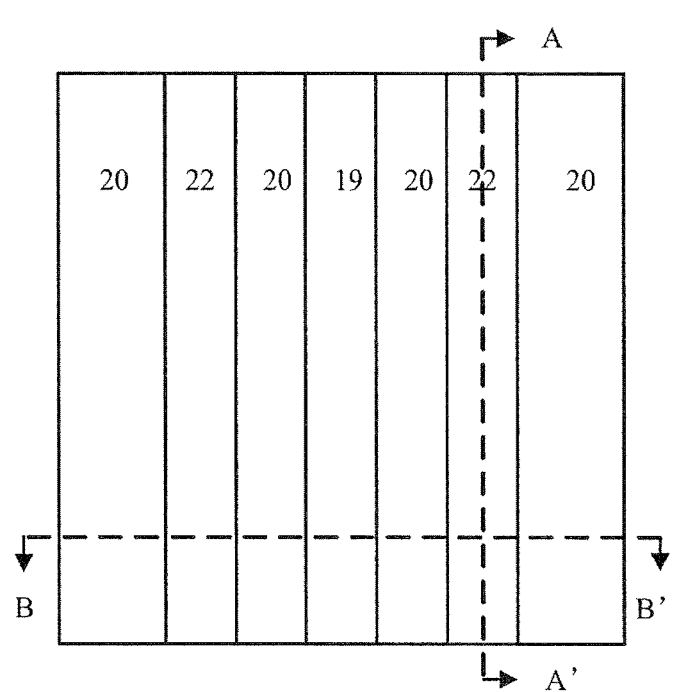
Figure 11B:
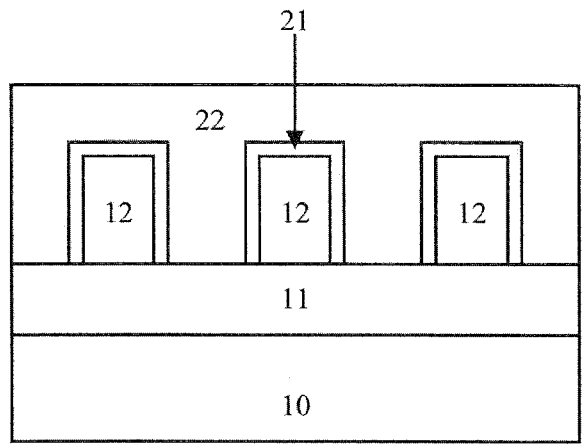
Figure 11C:
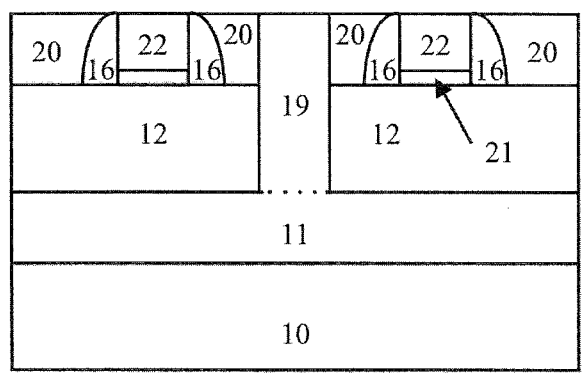

Then, the gate-last process is performed (see FIGS. 11A-11C, wherein FIG. 11A is a planar view. FIG. 11B is a cross-sectional view of FIG. 11A along the line AA', and FIG. 11C is a cross-sectional view of FIG. 11A along the line BB'). A gate-last process is employed in this embodiment. Thus, after forming a source/drain region contact 20, the polysilicon gate 15 and the gate insulating layer 14 formed previously are removed and then a gate insulating layer 21 and a gate 22 are formed in the gate-last process. As stated above, the gate insulating layer 21 in the gate-last process is, for example, a $SiO_2$ film, and more preferably, a high-K gate insulating material. High-K gate insulating materials have a larger dielectric constant than $SiO_2$ and may include some metal oxides, metal aluminates and the like, e.g., $HfO_2$, $ZrO_2$, $LaAlO_3$; the gate 22 may be made of a metal silicide, a metal and the like, for example, Al, W, Ti, Ta or their silicides.

Figure 12A:
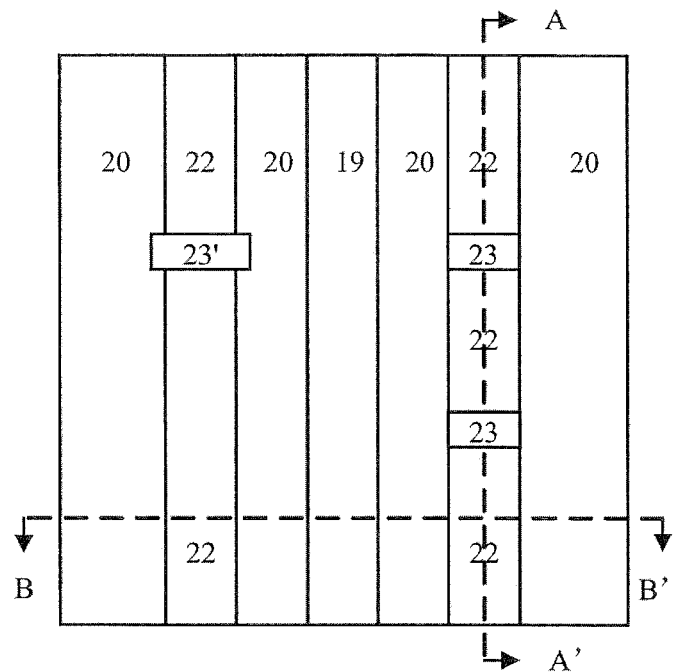
Figure 12B:
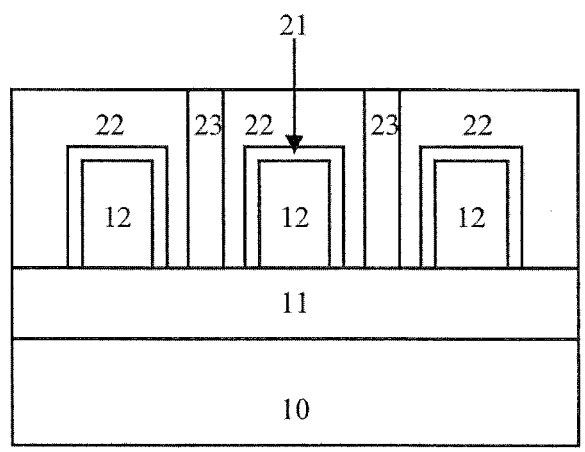

Then, a device isolation is formed so as to obtain the desired FinFET (see FIGS. 12A and 12B, wherein FIG. 12A is a planar view. FIG. 12B is a cross-sectional view of FIG. 11A along the line AA', the cross-sectional view of FIG. 12A along the line AA' being identical to Figure C; no repetition is made herein). In this step, a number of continuous parallel gates are cut in accordance with the predetermined region so as to obtain the desired FinFET. By an etching process, a gate isolation trench 23 is formed in the gate lines. Optionally, while a gate isolation trench is formed, the spacer 16 is also etched partially or totally (as shown by the gate isolation trench 23' in FIG. 12A). The gate isolation trench 23 (and 23') can be filled with an isolation dielectric such as $SiO_2$.

Then, other processes such as FinFET and integrated circuits can be carried out, e.g., the formation of a dielectric layer, the formation of a metal plug formation, and so on.

Thus, the present invention provides a method of manufacturing a FinFET device. In the present invention, the semiconductor Fins 12 intersecting the gates arranged in parallel are formed as a parallel arrangement, which facilitates cutting according to the requirements in the subsequent process so as to obtain the desired FinFET. The spacer 16 is formed on the side surfaces of a number of the Fins 12 and the gates 15, which on the one hand protects the sidewalls of the Fins 12 and the gates 15 and on the other hand provides an insulating isolation. By depositing the polycrystalline silicon layer and converting it into a single crystal silicon layer via laser annealing, the single crystal silicon layer and the Fins 12 are integrated in essence. Since an identical single crystal silicon layer 18 is formed at the top of the Fins 12 (i.e., the source/drain region in the Fins 12 is raised, and the top area of the Fins 12 is extended), it facilitates the formation of the subsequent source/drain region contact. Later, the single crystal silicon layer 18 above the top of the Fins 12 is converted into a metal silicide, thereby forming a source/drain region contact 20. Since the source/drain region contact 20 has a larger area than that in a conventional FinFET, the contact resistance decreases, which will facilitate the formation of a self-aligned metal plug in the follow-up process.

The present invention is described with the above embodiments. But these embodiments are only for illustrative purposes, and not for limiting the scope of the invention. The scope of the invention is defined by the appended claims and their equivalents. Without departing from the scope of the invention, skilled in the art can make a variety of replacements and modifications, which should fall within the scope of the invention.

The invention claimed is:

1. A method of manufacturing a semiconductor device for manufacturing a FinFET device, comprising:
   providing a semiconductor substrate, on which a plurality of semiconductor fins arranged in parallel are formed;
   depositing a gate insulation layer and a gate material, defining a gate pattern, forming a plurality of parallel gates which intersect the semiconductor fins, and defining the channel region of the FinFET;

forming a spacer located on side surfaces of the gates and the semiconductor fins;

depositing a polycrystalline silicon layer, and then planarizing the polycrystalline silicon layer to expose the top of the gates;

monocrystalizing the polycrystalline silicon layer to form a single crystal silicon layer;

forming an isolation structure which cuts off the semiconductor fins;

forming a metal silicide by reacting of the single crystal silicon layer located on top of the semiconductor fins with a metal, wherein the formed metal silicide is a source/drain region contact; and cutting the gates arranged in parallel in accordance with the predetermined region to form a gate isolation trench, thereby obtaining the desired FinFET.

2. The method according to claim 1, wherein the semiconductor substrate is an SOI substrate, or the semiconductor substrate is a single crystal substrate of Si, SiGe, SiC, InAs, GaN, AlGaN, InP, or any combination thereof, and the semiconductor fins is a single crystal material of Si, SiGe, SiC, InAs, GaN, AlGaN, or InP.

3. The method according to claim 2, wherein the formation of semiconductor fins arranged in parallel on the semiconductor substrate includes: forming the pattern of the semiconductor fins by lithography, and anisotropically etching the semiconductor substrate so as to form the semiconductor fins.

4. The method according to claim 1, wherein a gate-first process is employed, the gate is a non-sacrificial gate, and the material of the gate is a metal or metal silicide.

5. The method according to claim 1, wherein a gate-last process is employed, the gate is a sacrificial gate, and the material of the gate is polycrystalline silicon.

6. The method according to claim 5, wherein after the source/drain region contact is formed, the gate-last process is performed which includes:

removing the gates and the gate insulation layer; and forming a replacement gate insulation layer and a replacement gate in the gate-last process.

7. The method according to claim 6, wherein the replacement gate insulation layer in the gate-last process is a high-K gate insulating material, and the replacement gate in the gate-last process is a metal or metal silicide.

8. The method according to claim 6, wherein the material of the replacement gate insulation layer in the gate-last process is selected from $HfO_2$, $ZrO_2$, and $LaAlO_3$, and the material of the replacement gate in the gate-last process is selected from Al, W, Ti, Ta, or silicides thereof.

9. The method according to claim 1, wherein the step of monocrystalizing the polycrystalline silicon layer includes: converting the polycrystalline silicon layer into the single crystal silicon layer by a laser annealing process.

10. The method according to claim 9, wherein the laser annealing process is a high-temperature laser annealing process, and wherein the annealing temperature is 1000° C., and the time is 1 second.

11. The method according to claim 1, wherein the step of forming the spacer includes: depositing a spacer material layer on the semiconductor substrate, and then removing the spacer material layer on top of the gate and on top of the semiconductor fins by an anisotropic etching process, so that the spacer material is left only on side surfaces of the gates and the semiconductor fins so as to form the spacer.

12. The method according to claim 11, wherein the material of the spacer is $SiO_2$ or $Si_3N_4$.

13. The method according to claim 1, wherein the step of forming a gate isolation trench includes: cutting the plurality of gates by etching a predetermined region of the gate so as to form the gate isolation trench.

14. The method according to claim 13, wherein the spacer is partially or completely etched when forming the gate isolation trench.

15. The method according to claim 13, wherein after the gate isolation trench is formed, the gate isolation structure is filled with an isolation dielectric.

* * * * *